United States Patent [19]

Abbott

[11] 4,393,593

[45] Jul. 19, 1983

[54] REGISTER-PIN-LOCATING DEVICE

[76] Inventor: Robert P. Abbott, 7241 Garden Grove Blvd., Ste. E, Garden Grove, Calif. 92640

[21] Appl. No.: 305,926

[22] Filed: Sep. 28, 1981

[51] Int. Cl.$^3$ .............................................. B41B 1/00
[52] U.S. Cl. ................................ 33/184.5; 33/180 R; 33/484
[58] Field of Search .................... 33/184.5, 184.6, 464, 33/486, 173, 403, 180 R, 481, 430, 197, 167, 484

[56] References Cited

U.S. PATENT DOCUMENTS

| | | | |
|---|---|---|---|
| 1,048,333 | 12/1912 | Mishler | 33/197 X |
| 2,402,658 | 6/1946 | Nedela | 33/486 |
| 3,253,339 | 5/1966 | Capkovic | 33/184.5 |

FOREIGN PATENT DOCUMENTS 712135  10/1941  Fed. Rep. of Germany ........ 33/430

Primary Examiner—Harry N. Haroian
Attorney, Agent, or Firm—Francis X. Lojacono

[57] ABSTRACT

A register-pin-locating device used in conjunction with a steel ruler and a T-square to allow a stepping-and-repeating operation to any increment at any angle of an image in the art of photocomposing and like applications, a locator being mounted to a straight edge having marked units of measure so that register pins can be located at selective positions to receive negative or positive film in an accurate step-and-repeat manner on a suitable line-up table. The locator comprises a substantially flat thin plate having a longitudinal bend formed therein to define a pair of half sections horizontally offset from each other, wherein a pair of juxtaposed slots are disposed transversely to the bend, the slots being identically located in each of the half sections, so that the register pin can be received in either half section after the locator is secured to the straight edge.

7 Claims, 3 Drawing Figures

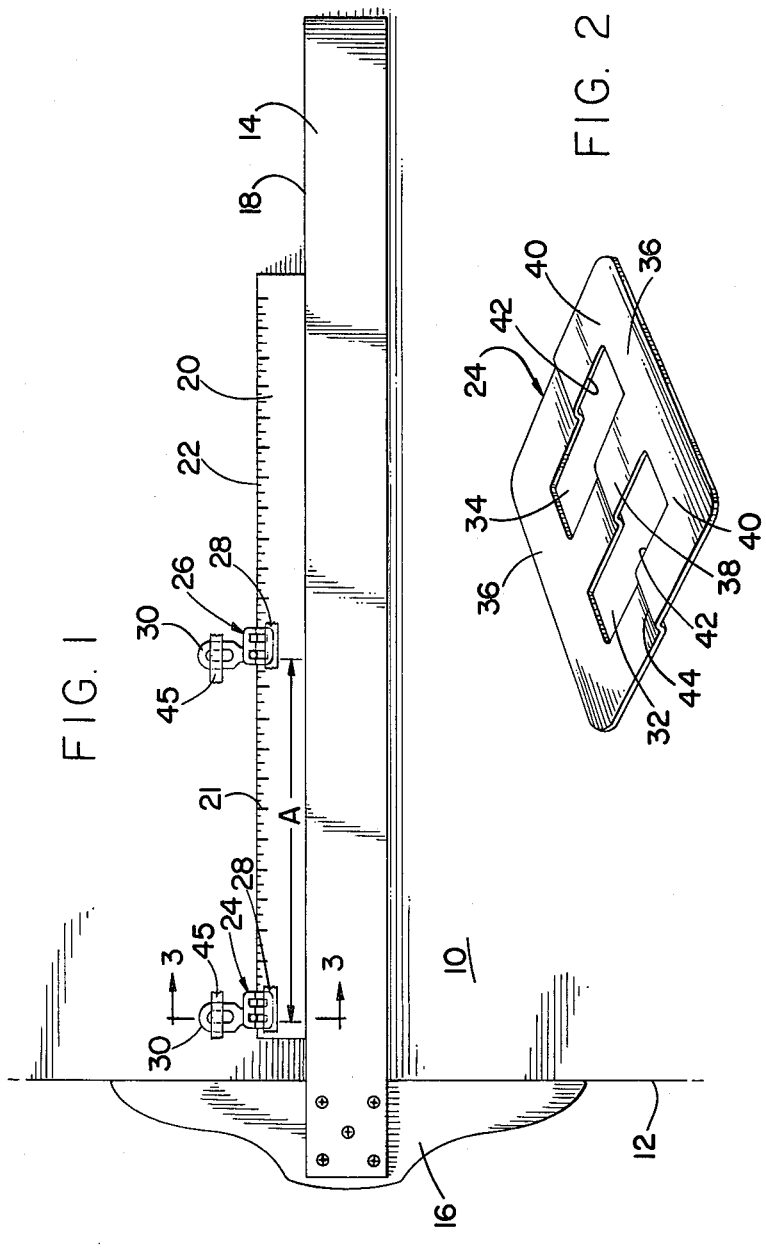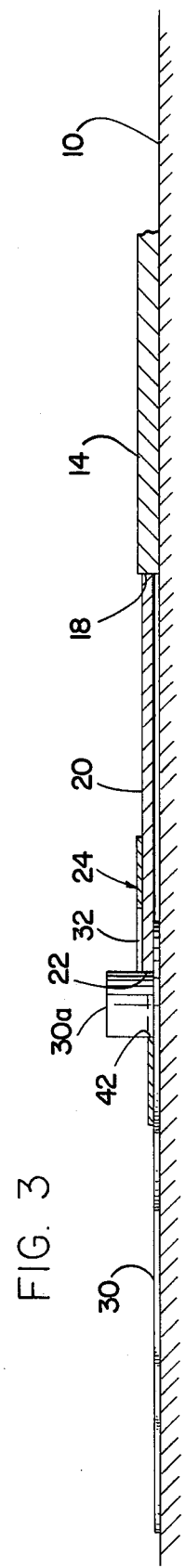

4,393,593

REGISTER-PIN-LOCATING DEVICE

BACKGROUND OF THE INVENTION

Field of the Invention

This invention relates generally to a means for stepping and repeating negatives or positives for photocomposing, and more particularly to a simple offset plate arranged to be mounted to a straight edge of a steel ruler or T-square to allow the stepping and repeating to any increment at any angle.

As is well known in the art, various problems and difficulties are being encountered in providing suitable means for the step-and-repeat processing of negatives and positives during photocomposing, particularly in the making of color plates for varied colors. Accuracy in registering the negatives into position is all important.

The known photocomposing machines are quite large and expensive. Also, these machines are not suitable for small companies in the printing and reproduction field, since they are not only expensive but they are very often complicated to install and operate, and they are not reliable in the accuracy required for repeated placement of register pins on a line-up table.

SUMMARY OF THE INVENTION

The present invention has for an important object to provide a very simple register-pin-locator device which will allow the operator to use the locators in a rapid and accurate manner, whereby register pins can be aligned to any given measurement at any angle.

Another object of the invention is to provide a register-pin locator which is designed to be mounted to a straight edge of a steel ruler, T-square, etc., having marked increments of measure in the form of inches or meters.

Still another object of the invention is to provide a register-pin locator which is formed from a substantially flat metal or plastic material and has a pair of spaced juxtaposed rectangular slots, each slot having a width equal to the diameter of the register pin.

It is still another object of the present invention to provide a device of this character which allows for one film piece to be employed versus a multiple number, wherein one film (positive or negative) can be stepped and repeated vertically, horizontally, as well as angularly, in a very accurate manner.

It is a further object of the invention to provide a device of this character which is adaptable for use with silk-screening, photography, printed-circuit boards, offset lithography, or in any other art that requires accurate step-and-repeat composing of images. That is, the present invention provides a device to register an image for printing many times on the same plate for gang or multiple printing.

Still another object of the invention is to provide a device of this character which is relatively inexpensive to manufacture, it being simple in construction.

The characteristics and advantages of the invention are further sufficiently referred to in connection with the accompanying drwings, which represent one embodiment. After considering this example, skilled persons will understand that variations may be made without departing from the principles disclosed; and I contemplate the employment of any structures, arrangements or modes of operation that are properly within the scope of the appended claims.

BRIEF DESCRIPTION OF THE DRAWINGS

Referring more particularly to the accompanying drawings, which are for illustrative purposes only:

FIG. 1 is a top-plan view of a straight-edge device having a ruler supported thereon, whereby a pair of pin locators are mounted to the ruler at a selective spacing for locating the register pins;

FIG. 2 is an enlarged perspective view of the present invention; and

FIG. 3 is an enlarged cross-sectional view taken substantially along line 3—3 of FIG. 1.

DESCRIPTION OF THE PREFERRED EMBODIMENT

Referring more particularly to FIG. 1, there is illustrated a portion of a line-up table, generally indicated at 10, having a squared edge 12. Positioned on the table in a typical manner is a T-square 14 with the lead member 16 squared against edge 12, thus establishing a squared straight edge 18. Located along the straight edge 18 is a ruler 20, preferably of steel, having suitably marked units or increments of inches, or meters, indicated at 21.

The present invention is shown mounted to the leading straight edge 22 of ruler 20 at two locations. The first register-pin locator, designated at 24, is affixed at the first leading unit of measure, normally marked zero (0); while the second locator 26 is spaced from the first locator and affixed at the proper point to provide a space corresponding to the size and arrangement of the film, not shown. In this illustration, the second locator 26 is positioned twelve one-inch units from the first locator 24. Each locator is secured to the ruler 20 by a suitable means such as tape 28.

Register-pin members 30 are then fitted to each locator and secured to table 10. In order to establish the locations of additional pin members 30, one need only raise ruler 20 with the locator still affixed thereto, placing locator 24 on the last pin member and positioning the additional pin member in the preset alignment with the first two pins.

It should be noted that any suitable staight-edge means can be employed in place of ruler 20. As an example, a T-square having increments marked thereon could be employed, without the need for ruler 20.

FIG. 2 is an enlarged view of register-pin locator 24 which is formed from a thin substantially flat plate, preferably of metal or plastic. The plate has a rectangular configuration, a pair of elongated rectangular slots 32 and 34 being formed therein transversely between edges 36, and each slot being one-quarter inch ($\frac{1}{4}$") wide and one-half inch ($\frac{1}{2}$") long. The intermediate web member 38 and the end members 49 are likewise one-quarter inch ($\frac{1}{4}$") wide.

However, it should be noted that the peripheral edges 42 of each slot are used as the set points. That is, in FIG. 1 the distance (A) is measured from each corresponding edge of the pair of locators. Thus, on ruler 20 the locators are spaced exactly twelve inches (12") apart.

The plate also includes a centrally disposed bend 44 dividing the plate into two contiguous equal sections, whereby each section is offset from the other. This allows the locator to be used from either section. In FIG. 3, plate 24 is mounted along edge 22 of ruler 20, whereby one section is flat against the flat surface of ruler 20, and the other section is extended outwardly and placed against register pin member 30. Pin 30a is fitted tightly in one-half of the slot 32, thus engaging peripheral edges 42 and straight edge 22 of ruler 20. Therefore, when the second reguster-pin member is positioned in the corresponding slot 42, as illustrated in FIG. 1, the center points of the pins 30a are exactly twelve inches apart.

Accordingly, each succeeding step-and-repeat pin will be spaced identically as indicated. However, pins 30a must have a diameter equal to the width of the slots. As examples, if the widths of the slots are one-quarter inch ($\frac{1}{4}''$), the length is doubled to one-half inch ($\frac{1}{2}''$), requiring a pin diameter of one-quarter inch ($\frac{1}{4}''$). If the diameter of the pin used is three-eighth inch ($\frac{3}{8}''$), the slot width must be three-eighth inch ($\frac{3}{8}''$) and the length three-quarter inch ($\frac{3}{4}''$).

Each time a register-pin member is located, it is suitably fixed to the table top by tape 45. After all the pins are in their respective positions, pin tabs (not shown) are attached to the masking flat or jig of the film, whereby the film is sequentially positioned with respect to the aligned pins. Hence, a very accurate step-and-repeat operation is accomplished.

The invention and its attendant advantages will be understood from the foregoing description; and it will be apparent that various changes may be made in the form, construction and arrangement of the parts of the invention without departing from the spirit and scope thereof or sacrificing its material advantages, the arrangement hereinbefore described being merely by way of example; and I do not wish to be restricted to the specific form shown or uses mentioned except as defined in the accompanying claims.

I claim:

1. A register-pin-locating device, comprising:
   a substantially flat rectangular plate having a longitudinal bend formed therein, defining first and second half sections
   wherein said first and second half sections are horizontally offset from each other; and
   at least one elongated slot formed in said plate transversely to said bend, said slot being equally disposed in each of said half sections.

2. A register-pin-locating device as recited in claim 1, wherein said plate includes two juxtaposed slots, said slots being selectively spaced apart from each other.

3. A register-pin-locating device as recited in claim 2, wherein an intermediate member is formed having a width equal to the width of each of said slots.

4. A register-pin-locating device as recited in claim 3, wherein the length of each of said slots formed in each half section is equal to the width thereof.

5. In combination, a register-pin-locating device adapted for use in the step-and-repeat operation of the same image in the art of photocomposing and like applications, comprising:
   a straight-edge member having increments of measure marked thereon;
   a register pin;
   a locator adapted to engage said straight edge, to locate said register pin at a selective position;
   wherein said locator comprises a substantially flat rectangular plate having a longitudinal bend formed therein, defining a pair of half sections horizontally offset from each other; and
   wherein said locator comprises at least one elongated slot formed in said plate transversely to said bend, said slot being equally disposed in each of said half sections and being adapted to receive said register pin therein.

6. The combination as recited in claim 5, wherein said plate includes a pair of juxtaposed elongated slots, each having an intermediate web member to selectively space said slots relative to each other.

7. The combination as recited in claim 6, wherein the width of each of said slots is equal to the diameter of said register pin, and the length of each of said slots is at least twice the width thereof.

* * * * *